United States Patent
Pai et al.

[11] Patent Number: 6,133,062
[45] Date of Patent: Oct. 17, 2000

[54] METHOD OF FABRICATING FOCUSING AND COLOR-FILTERING STRUCTURE FOR SEMICONDUCTOR LIGHT-SENSITIVE DEVICE

[75] Inventors: Yuan-Chi Pai, Nantou; Wei-Chiang Lin, Hsinchu, both of Taiwan

[73] Assignee: United Microelectronics Corp., Taiwan

[21] Appl. No.: 09/138,759

[22] Filed: Aug. 24, 1998

[30] Foreign Application Priority Data

May 4, 1998 [TW]  Taiwan .................................. 87106844

[51] Int. Cl.$^7$ ........................................................ H01L 21/31
[52] U.S. Cl. ............................................. 438/70; 438/697
[58] Field of Search .................. 438/70, 697, FOR 136, 438/FOR 137, FOR 388

[56] References Cited

U.S. PATENT DOCUMENTS 5,256,592  10/1993  Matsushita .
5,426,058   6/1995  Nakai et al. .
5,965,939  10/1999  Kim et al. .

FOREIGN PATENT DOCUMENTS 62-242360  10/1987  Japan .
6132515     5/1994  Japan .
7311310    11/1995  Japan .

*Primary Examiner*—George Fourson
*Attorney, Agent, or Firm*—Christie, Parker & Hale, LLP

[57] ABSTRACT

An improved focusing and color-filtering structure is provided for use in a semiconductor light-sensitive device, such as CMOS (complementary metal-oxide semiconductor) light-sensitive device, that can be used, for example, on a digital camera or a PC camera to convert photographed image directly into digital form. The focusing and color-filtering structure is used for the focusing and color-filtering of the light incident thereon prior to the light being detected by the light-sensitive device. The focusing and color-filtering structure is characterized in the forming of a dummy pattern layer in the non-filter area surrounding the array of color-filter layers, which allows the subsequently formed planarization layer to be highly planarization with a substantially uniformly flat top surface without having slopes such that the subsequently formed microlenses can all be disposed upright in position without being slanted. The focusing and color-filtering structure has the benefit of allowing the quality of the photographed image to be more assured without being degraded by the ambient scatting light as in the prior art.

22 Claims, 3 Drawing Sheets

METHOD OF FABRICATING FOCUSING AND COLOR-FILTERING STRUCTURE FOR SEMICONDUCTOR LIGHT-SENSITIVE DEVICE

CROSS-REFERENCE TO RELATED APPLICATION

This application claims the priority benefit of Taiwan application serial no. 87106844, filed May 4, 1998, the full disclosure of which is incorporated herein by reference.

BACKGROUND OF THE INVENTION

1. Field of the Invention

This invention relates to light-sensitive devices, and more particularly, to a focusing and color-filtering structure for use in a semiconductor light-sensitive device, such as a CMOS (complementary metal-oxide semiconductor) light-sensitive device and a method of fabricating the same.

2. Description of Related Art

A digital camera, or a PC (personal computer) camera, is a digital photographic apparatus that can produce photographed images directly in digital form instead of on traditional films, thus allowing immediate computer processing of the photographed images. A conventional digital camera typically includes an array of light-sensitive cells, such as CMOS (complementary metal-oxide semiconductor) light-sensitive diodes, which can convert the light incident thereon into analog electrical signals that can be further converted into digital form. These CMOS light-sensitive diodes are formed on a semiconductor substrate. Further, a focusing and color-filtering structure is formed over the CMOS light-sensitive diodes for focusing the incident light onto the corresponding light-sensitive diodes and also for separating the incident light into the three primary components, i.e., red (R), green (G), and blue (B) components prior to the light being detected by the light-sensitive diodes.

A conventional focusing and color-filtering structure for a CMOS light-sensitive device is illustratively depicted in the following with reference to FIGS. 1A–1B.

As shown in FIG. 1A, the CMOS light-sensitive device is constructed on a semiconductor substrate 10. A passivation layer 12 is formed over the substrate 10. Next, a plurality of color-filter layers 14 are formed over the passivation layer 12, each of the color-filter layers 14 consisting of a red-filter region (not shown), a green-filter region (not shown), and a blue-filter region (not shown), which are formed, for example, from acrylic materials of the respective color-filtering qualities. A planarization layer 16 is then deposited over the color-filter layers 14.

It is illustratively shown in FIG. 1A that the part of the planarization layer 16 that is deposited over the area where the color-filter layers 14 are located (hereinafter referred to as the filter area) and the part of the planarization layer 16 that is deposited over the area beyond the filter area (hereinafter referred to as the non-filter area) would have uneven thicknesses, resulting in a slope (as indicated by the reference numeral 18 in FIG. 1A) at the border between the filter area and the non-filter area. The forming of this slope 18 would cause some undesired drawbacks to the focusing and color-filtering structure, which will be described later.

Referring next to FIG. 1B, in the subsequent step, an array of microlenses 19 are formed over the planarization layer 16, with each of the microlenses 19 being aligned with one of the color-filter layers 14. The microlenses 19 are each used to focus the light incident thereon through the color-filter layers 14 onto the corresponding one of the light-sensitive diodes (not shown) in the substrate 10. This completes the fabrication of the CMOS light-sensitive device. The microlenses 19, the planarization layer 16, and the color-filter layers 14 are in combination referred to as a focusing and color-filtering structure for the CMOS light-sensitive device.

One drawback to the foregoing focusing and color-filtering structure, however, is that some of the microlenses 19 that are disposed on the slope 18 will have their optical axis slanted and thus misaligned with their corresponding light-sensitive diodes, thus resulting in a shift in the focused point. Moreover, since those of the microlenses 19 on the slope 18 are somewhat lower in position than those of the microlenses 19 that are not, the photographed image can be defocused, thus resulting in a blurred image. Still moreover since those of the microlenses 19 on the slope 18 are somewhat inclined sidewards, the ambient scattering light from the side can easily enter into these microlenses 19 on the slope 18 thus resulting in an undesired reception of unwanted light that would further degrade the quality of the photographed image.

SUMMARY OF THE INVENTION

It is therefore an objective of the present invention to provide an improved focusing and color-filtering structure for CMOS light-sensitive device and a method of fabricating the same, which can allow the planarization layer mentioned in the foregoing background section to be formed with a substantially uniformly flat top surface without having slopes thus allowing the subsequently formed microlenses to be all disposed upright in position without being slanted.

In accordance with the foregoing and other objectives of the present invention, an improved focusing and color-filtering structure for CMOS light-sensitive device and a method of fabricating the same are provided.

The focusing and color-filtering structure of the invention includes the following constituent elements: a passivation layer formed over the substrate; an array of color-filter layers formed over a selected area on the passivation layer; at least one dummy pattern layer formed over the passivation layer surrounding the array of color-filter layers; a planarization layer covering all of the color-filter layers and the dummy pattern layer; and an array of microlenses formed over the planarization layer, with each of the microlenses being aligned with one of the underlying color-filter layers.

The method of the invention for fabricating the foregoing focusing and color-filtering structure includes the following steps of:

(1) forming a passivation layer over the substrate;

(2) forming an array of color-filter layers over a selected area on the passivation layer;

(3) forming at least one dummy pattern layer over the passivation layer surrounding the array of color-filter layers;

(4) forming a planarization layer which covers all of the color-filter layers and the dummy pattern layer; and (5) forming an array of microlenses over the planarization layer, with each of the microlenses being aligned with one of the underlying color-filter layers.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides an improved focusing and color-filtering structure for CMOS light-sensitive device and a method of fabricating the same. The focusing and color-filtering structure of the invention is characterized in the forming of a dummy pattern layer in the non-filter area surrounding the filter area where an array of color-filter layers are formed. The forming of this dummy pattern layer allows the subsequently formed planarization layer to be highly planarized with a substantially uniformly flat top surface without having slopes, thus allowing the subsequently formed microlenses to be all disposed upright in position without being slanted. As a result, the drawbacks of the prior art as mentioned in the background section of this specification can be eliminated.

In accordance with the invention, two preferred embodiments are disclosed, which will be described in the following with reference to FIGS. 2A–2D and FIGS. 3A–3D respectively.

First Preferred Embodiment

FIGS. 2A–2D are schematic sectional diagrams used to depict a first preferred embodiment of the focusing and color-filtering structure of the invention for a semiconductor light-sensitive device, such as a CMOS light-sensitive device, and also the steps involved in the method of invention for fabricating the focusing and color-filtering structure.

Figure 1A:
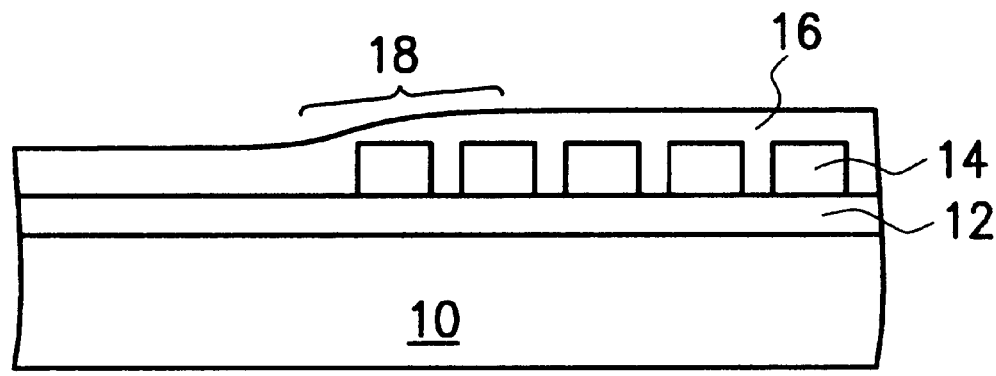
FIGS. 1A–1B are schematic sectional diagrams used to depict the steps involved in a conventional method for fabricating a CMOS light-sensitive device with a conventional focusing and color-filtering structure.
Figure 1B:
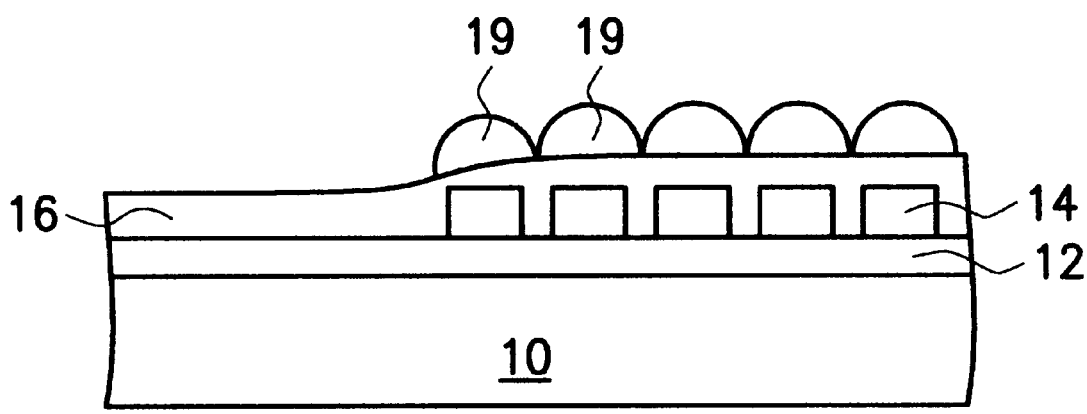
Figure 2A:
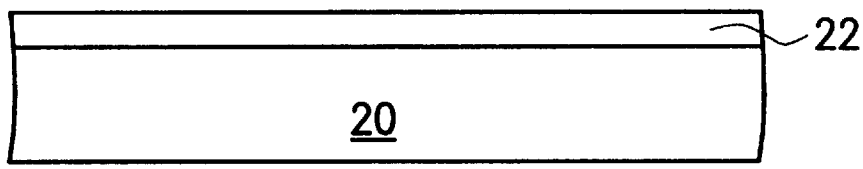
FIGS. 2A–2D are schematic sectional diagrams used to depict the steps involved in a first preferred embodiment of the method of invention for fabricating a CMOS light-sensitive device with the focusing and color-filtering structure of the invention.

Referring to FIG. 2A, the CMOS light-sensitive device is constructed on a semiconductor substrate 20 (Note that this substrate 20 is already formed with a sensor area where an array of light-sensitive diode elements are formed for the light detection purpose, but since the forming and structure of these light-sensitive diode element are conventional and not within the scope and spirit of the invention, they are eliminated and not shown in the drawings). Over the substrate 20, a passivation layer 22 is formed, preferably from silicon oxide or silicon nitride.

Figure 2B:
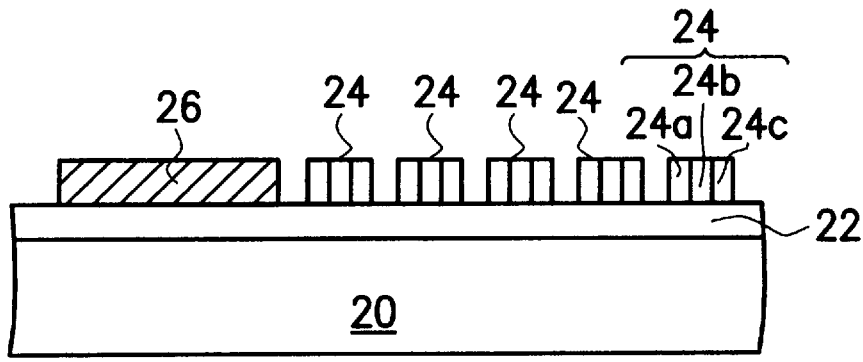

Referring next to FIG. 2B, in the subsequent step, an array of color-filter layers 24 are formed over the passivation layer 22, each of the color-filter layers 24 consisting of a red-filter region 24a, a green-filter region 24b, and a blue-filter region 24c, which are disposed side by side and formed from acrylic materials of the respective color-filtering qualities. These RGB filter regions in the color-filter layers 24 can be formed through conventional processes, such as an electrolysis process, a dyeing process, or a pigmentation process.

It is a characteristic part of the invention that a dummy pattern layer 26 is formed over the non-filter area surrounding the array of color-filter layers 24 to a thickness substantially equal to the thickness of the color-filter layers 24. In this embodiment, the dummy pattern layer 26 is an integral layer surrounding the array of color-filter layers 24. The dummy pattern layer 26 is preferably formed from the same material, for example an acrylic material of a blue-filter quality, that is also used to form the blue-filter region 24c. The dummy pattern layer 26 can be formed through either an electrolysis process, a dyeing process, or a pigmentation process that is also used to form the blue-filter region 24c. The blue-filter material quality allows the dummy pattern layer 26 to have minimum dispersion as compared to other materials.

Figure 2C:
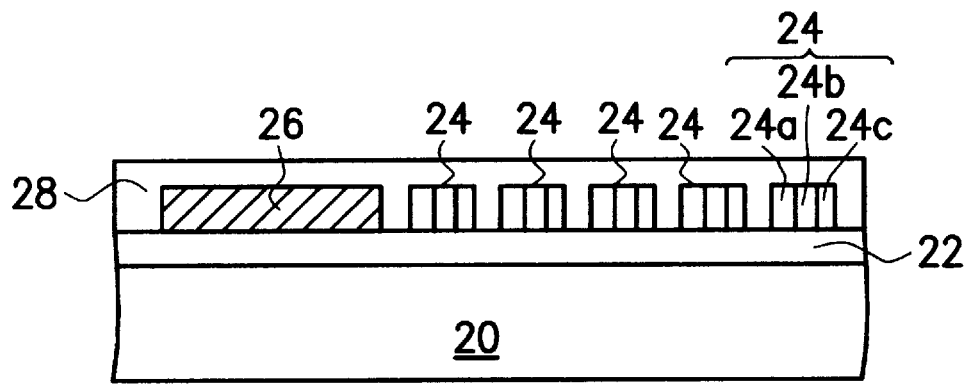

Referring next to FIG. 2C, in the subsequent step, a planarization layer 28 is formed, preferably from an acrylic material, over the entire top surface of the wafer, covering all of the color-filter layers 24 and the dummy pattern layer 26. It is illustratively shown in FIG. 2C that, with the provision of the dummy pattern layer 26, the planarization layer 28 can be formed with a substantially uniformly flat top surface without having slopes as in the prior art.

Figure 2D:
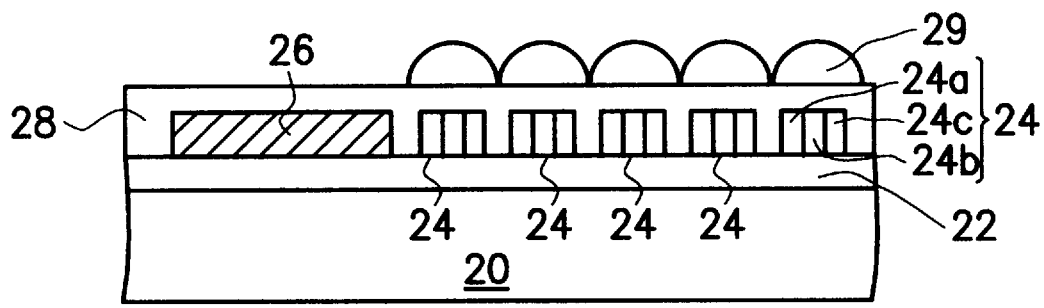

Referring further to FIG. 2D, in the subsequent step, an array of microlenses 29 are formed over the planarization layer 28, with each of the microlenses 29 being layered directly above one of the underneath color-filter layers 24. The microlenses 29 are each convex in shape that can focus the light incident thereon onto the corresponding light-sensitive diodes (not shown) in the substrate 20. The forming of the microlenses 29 includes photolithography and curing, which are conventional processes so description thereof will not be further detailed. This completes the fabrication of the CMOS light-sensitive device. In this CMOS light-sensitive device, the microlenses 29, the color-filter layers 24, the planarization layer 28, and the dummy pattern layer 26 in combination constitute a focusing and color-filtering structure for the CMOS light-sensitive device.

Second Preferred Embodiment

FIGS. 3A–3D are schematic sectional diagrams used to depict a second preferred embodiment of the focusing and color-filtering structure of the invention for a semiconductor light-sensitive device, such as a CMOS light-sensitive device, and also the steps involved in the method of invention for fabricating the focusing and color-filtering structure.

Figure 3A:
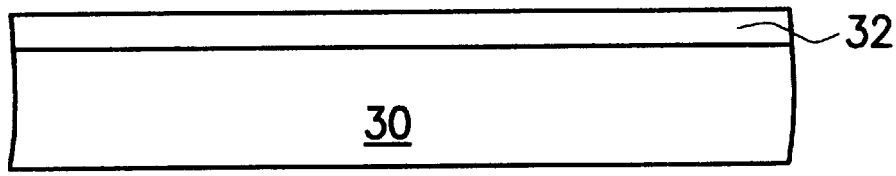
FIGS. 3A–3D are schematic sectional diagrams used to depict the steps involved in a second preferred embodiment of the method of invention for fabricating a CMOS light-sensitive device with the focusing and color-filtering structure of the invention.

Referring to FIG. 3A, the CMOS light-sensitive device is constructed on a semiconductor substrate 30 (Note that this substrate 30 is already formed with a sensor area where an array of light-sensitive diode elements are formed for the light detection purpose, but since the forming and structure of these light-sensitive diode element are conventional and not within the scope and spirit of the invention, they are eliminated and not shown in the drawings). Over the substrate 30, a passivation layer 32 is formed, preferably from silicon oxide or silicon nitride.

Figure 3B:
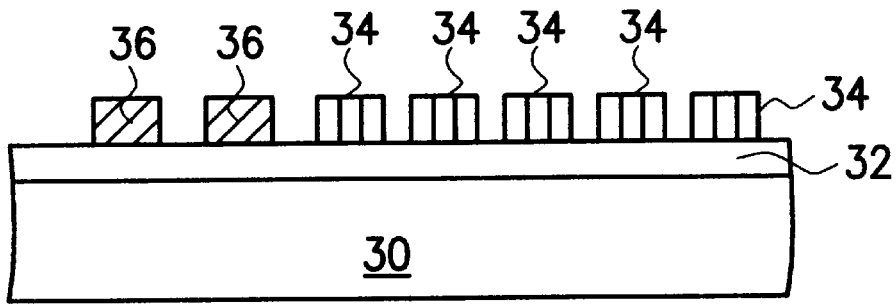

Referring next to FIG. 3B, in the subsequent step, an array of color-filter layers 34 are formed over the passivation layer 32, each of the color-filter layers 34 consisting of a red-filter region 34a, a green-filter region 34b, and a blue-filter region 34c, which are disposed side by side and preferably formed from acrylic materials of the respective color-filtering qualities. These RGB filter regions in the color-filter layers 34 can be formed through conventional processes, such as an electrolysis process, a dyeing process, or a pigmentation process.

It is a characteristic part of the invention that a dummy pattern layer including a plurality of separate blocks 36 are formed over the non-filter area that surrounds the array of color-filter layers 34 to a thickness substantially equal to the thickness of the color-filter layers 34. This embodiment differs from the previous one particularly in that the dummy pattern layer 36 here is formed into a plurality of blocks, each being substantially equal in width and thickness to each of the color-filter layers 34. The dummy pattern layer 36 is preferably formed from the same material, for example an acrylic material of a blue-filter quality, that is also used to form the blue-filter region 34c. The dummy pattern layer 36 can be formed through either an electrolysis process, a dyeing process, or a pigmentation process that is also used to form the blue-filter region 34c. The blue-filter material quality allows the dummy pattern layer 36 to have minimum dispersion as compared to other materials.

Figure 3C:
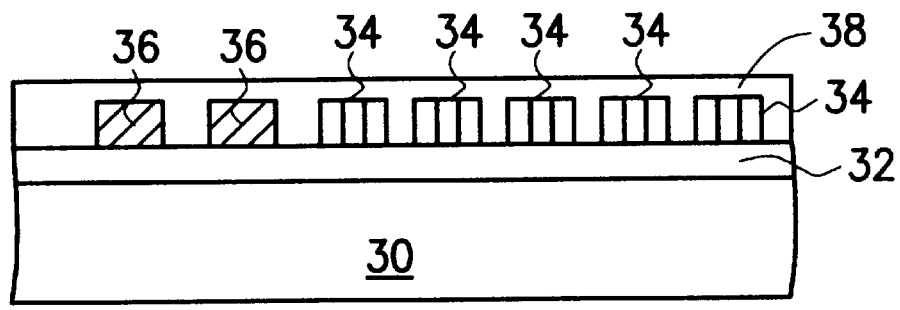

Referring next to FIG. 3C, in the subsequent step, a planarization layer 38 is formed, preferably from an acrylic material, over the entire top surface of the wafer, covering all of the color-filter layers 34 and the dummy pattern layer 36. It is illustratively shown in FIG. 3C that, with the provision of the dummy pattern layer 36, the planarization layer 38 can be formed with a substantially uniformly flat top surface without having slopes as in the prior art.

Figure 3D:
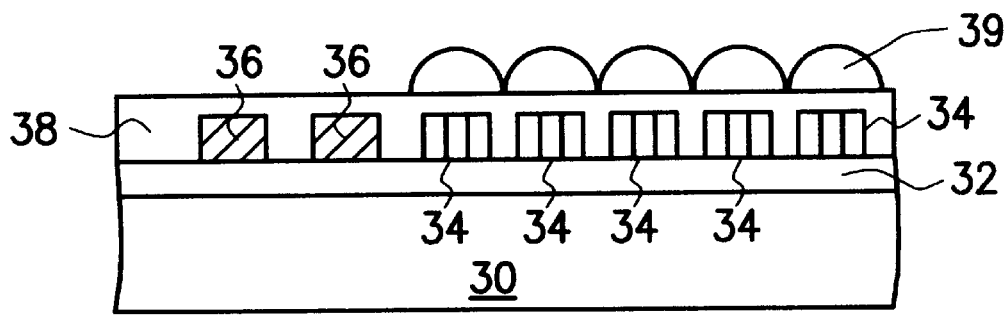

Referring further to FIG. 3D, in the subsequent step, an array of microlenses 39 are formed over the planarization layer 38, with each of the microlenses 39 being layered directly above one of the underneath color-filter layers 34. The microlenses 39 are each convex in shape that can focus the light incident thereon onto the corresponding light-sensitive diodes (not shown) in the substrate 30. The forming of the microlenses 39 includes photolithography and curing, which are conventional processes so description thereof will not be further detailed. This completes the fabrication of the CMOS light-sensitive device. In this CMOS light-sensitive device, the microlenses 39, the color-filter layers 34, the planarization layer 38, and the dummy pattern layer 36 in combination constitute a focusing and color-filtering structure for the CMOS light-sensitive device.

In conclusion, the invention has the following advantages over the prior art.

(1) First, the invention is characterized in the forming of a dummy pattern layer in the non-filter area surrounding the array of color-filter layers, which allows the subsequently formed planarization layer to be highly planarized with a substantially uniformly flat top surface without having slopes such that the subsequently formed microlenses can all be disposed upright in position without being slanted.

(2) Second, since the dummy pattern layer is formed from the same material used to form the blue-filter regions, it can have minimum dispersion that can reduce the undesired effect from the ambient scattering light, thus more assuring the quality of the photographed image.

(3) Third, the invention is suitable for use in all kinds of CMOS light-sensitive devices that require the forming of an array of microlenses above an array of color-filter layers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a focusing and color-filtering structure for a light-sensitive device constructed on a semiconductor substrate, comprising the steps of:
   (1) forming a passivation layer over the substrate;
   (2) forming an array of color-filter layers over a predefined filter area on the passivation layer;
   (3) forming a dummy pattern layer over a predefined non-filter area on the passivation layer surrounding the array of color-filter layers;
   (4) forming a planarization layer which covers all of the color-filter layers and the dummy pattern layer; and
   (5) forming an array of microlenses over the planarization layer, with each of the microlenses being aligned with one of the underneath color-filter layers.

2. The method of claim 1, wherein the passivation layer is formed from silicon oxide.

3. The method of claim 1, wherein the passivation layer is formed from silicon nitride.

4. The method of claim 1, wherein the color-filter layers are formed from acrylics of red, green, and blue filter qualities.

5. The method of claim 1 wherein the planarization layer is formed from an acrylic material.

6. The method of claim 1, wherein each of the color-filter layers includes:
   a red-filter region formed over the passivation layer;
   a green-filter region formed beside the red-filter region over the passivation layer; and
   a blue-filter region formed beside the red-filter region and the green-filter region over the passivation layer.

7. The method of claim 6, wherein the dummy pattern layer is formed from an acrylic material of a blue-filter quality that is also used to form the blue-filter region in each of the color-filter layers.

8. The method of claim 1, wherein the dummy pattern layer is formed an acrylic material.

9. The method of claim 1, wherein the dummy pattern layer is substantially equal in thickness as each of the color-filter layers over the passivation layer.

10. The method of claim 1, wherein the dummy pattern layer is formed into a plurality of separate blocks.

11. The method of claim 10, wherein each of the blocks of the dummy pattern layer is substantially equal in dimensions as each of the color-filter layers.

12. The method of claim 1, wherein the microlenses are each convex in shape.

13. A method for fabricating a focusing and color-filtering structure for a light-sensitive device constructed on a semiconductor substrate, comprising the steps of:
   (1) forming a passivation layer over the substrate;
   (2) forming an array of color-filter layers over a predefined filter area on the passivation layer;
   (3) forming a dummy pattern layer over a predefined non-filter area on the passivation layer surrounding the array of color-filter layers, with the dummy pattern layer being substantially equal in thickness as each of the color-filter layers;
   (4) forming a planarization layer which covers all of the color-filter layers and the dummy pattern layer; and
   (5) forming an array of microlenses over the planarization layer, with each of the microlenses being aligned with one of the underneath color-filter layers and being convex in shape.

14. The method of claim 13, wherein the passivation layer is formed from silicon oxide.

15. The method of claim 13, wherein the passivation layer is formed from silicon nitride.

16. The method of claim 13, wherein the color-filter layers are formed from acrylics of red, green, and blue filter qualities.

17. The method of claim 13, wherein the planarization layer is formed from an acrylic material.

18. The method of claim 13, wherein each of the color-filter layers includes:

a red-filter region formed over the passivation layer;

a green-filter region formed beside the red-filter region over the passivation layer; and a blue-filter region formed beside the red-filter region and the green-filter region over the passivation layer.

19. The method of claim 18, wherein the dummy pattern layer is formed from an acrylic material of a blue-filter quality that is also used to form the blue-filter region.

20. The method of claim 13, wherein the dummy pattern layer is formed from an acrylic material.

21. The method of claim 13, wherein the dummy pattern layer is formed into a plurality of separate blocks.

22. The method of claim 21, wherein each of the blocks of the dummy pattern layer is substantially equal in dimensions as each of the color-filter layers.

* * * * *